United States Patent
Shcherbyna

(10) Patent No.: US 11,652,571 B1
(45) Date of Patent: May 16, 2023

(54) INCREMENTAL CYCLIC REDUNDANCY (CRC) PROCESS

(71) Applicant: Harmonic, Inc., San Jose, CA (US)

(72) Inventor: Pavlo Shcherbyna, Santa Clara, CA (US)

(73) Assignee: Harmonic, Inc., San Jose, CA (US)

( * ) Notice: Subject to any disclaimer, the term of this patent is extended or adjusted under 35 U.S.C. 154(b) by 37 days.

(21) Appl. No.: 16/197,124

(22) Filed: Nov. 20, 2018

Related U.S. Application Data

(60) Provisional application No. 62/588,841, filed on Nov. 20, 2017.

(51) Int. Cl.
*H04L 1/00* (2006.01)
*H04L 69/324* (2022.01)
*H04L 69/22* (2022.01)
*H03M 13/09* (2006.01)

(52) U.S. Cl.
CPC .......... *H04L 1/0041* (2013.01); *H04L 1/0061* (2013.01); *H04L 69/22* (2013.01); *H04L 69/324* (2013.01); *H03M 13/093* (2013.01)

(58) Field of Classification Search
CPC .. H03M 13/093; H04L 69/324; H04L 1/0061; H04L 69/22
See application file for complete search history.

(56) References Cited

U.S. PATENT DOCUMENTS

| | | | | |
|---|---|---|---|---|
| 5,251,215 A * | 10/1993 | Dravida | ............... | H03M 13/093 341/94 |
| 2004/0025105 A1* | 2/2004 | Doubler | ................ | H04L 1/0061 714/781 |
| 2006/0059411 A1* | 3/2006 | Dacosta | ................ | H04L 1/0051 714/794 |
| 2009/0006921 A1* | 1/2009 | Engberg | .............. | H03M 13/093 714/752 |
| 2009/0154495 A1* | 6/2009 | Ojala | ...................... | H04L 1/008 370/469 |
| 2018/0143872 A1* | 5/2018 | Sun | ...................... | H03M 13/091 |

OTHER PUBLICATIONS

Kowalk, W. "CRC Cyclic Redundancy Check Analysing and Correcting Errors". Universität Oldenburg, Aug. 2006.*

* cited by examiner

*Primary Examiner* — Steve N Nguyen
(74) *Attorney, Agent, or Firm* — Brokaw Patent Law PC; Christopher J. Brokaw

(57) ABSTRACT

Performing a constant time cyclic redundancy check (CRC) over an entire packet to obtain a constant time CRC value. A first CRC is performed on an original header of the packet and a second CRC is performed on a modified header of the packet. The size of the payload of the packet is obtained. An XOR operation is performed on the results of the first and second CRC to calculate a third result. An intermediate CRC value is obtained by performing a CRC on a number of zero values corresponding to the size of the payload using the third result as an initial value. The intermediate CRC value may be employed with other packets having a same size and same header as the packet. The constant time CRC value is obtained by performing an XOR operation on the intermediate CRC value and the original CRC value contained in the packet.

15 Claims, 4 Drawing Sheets

INCREMENTAL CYCLIC REDUNDANCY (CRC) PROCESS

CLAIM OF PRIORITY

This application claims priority to U.S. Provisional Patent Application Ser. No. 62/588,841, filed Nov. 20, 2017, entitled "Incremental CRC Process" the contents of which are hereby incorporated by reference for all purposes as if fully set forth herein.

FIELD OF THE INVENTION

Embodiments of the invention relate to data verification performed on exchanged data packets.

BACKGROUND

Anytime data is converted from an analog format to a digital format, or vice-versa, there is a possibility that the conversion may inadvertently convert one or more bits of data incorrectly. In the transmission of digital data, it is sometimes necessary to convert digital data into analog signals to facilitate its propagation. To detect if any data has been inadvertently changed during transmission, an error-detecting code, such as a cyclic redundancy check (CRC), is often employed. When a system uses a CRC, a block of data is assigned a short check value, based on the remainder of a polynomial division of their contents. On retrieval of the block of data, the calculation is repeated and, in the event the check values do not match, corrective action can be taken against data corruption. CRCs can be used for both error correction as well as error identification.

The check value constituting a CRC is redundant in that it expands the message without adding information. The algorithm used to create the check value of a CRC is cyclic in that it is based on cyclic codes. CRCs are popular because they are simple to implement in binary hardware, easy to analyze mathematically, and particularly good at detecting common errors caused by noise in transmission channels.

Many software applications have a need to calculate a cyclic redundancy check (CRC) for processed Ethernet frames. For instance, this process is performed in software, rather than by hardware, when the packet is encapsulated several times after the CRC calculation. As a result, hardware may only need to append the CRC to the final Ethernet frame.

The calculation of a CRC can become a bottleneck for two reasons. First, the calculation of a CRC has a linear asymptotic complexity and depends on the number of bytes in the packet. Second, for software to calculate a CRC, the software requires access to the data carried by the packet (i.e., the "payload"), which is known to be a slow operation because such data should be loaded from memory to the CPU cache. Regardless of whether the payload is prefetched or loaded to the CPU cache to facilitate the calculation of the CRC, the CPU cache becomes clogged. This, in turn, leads to evicting other data from the cache, which further increases the latency in processing requests to access the other data evicted from the cache.

An approach for performing an incremental CRC update, as described by Mark Adler on the web site www <dot> stackoverlow <dot> com, involves calculating a CRC in logarithmic time. However, this technique discussed by Mark Adler suffers from the disadvantage in that it requires multiple matrix multiplications and extra CPU cache usage.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for performing a cyclic redundancy check (CRC) on a data packet in constant time are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Embodiments of the invention are directed towards performing a cyclic redundancy check (CRC) on a data packet. Advantageously, embodiments of the invention may perform an incremental CRC update upon a data packet in constant time. For this reason, the CRC value obtained by an embodiment may be referred to herein as a constant time CRC value. To achieve such CRC calculation performance, embodiments do employ the use of additional memory compared to prior approaches.

Figure 1A:
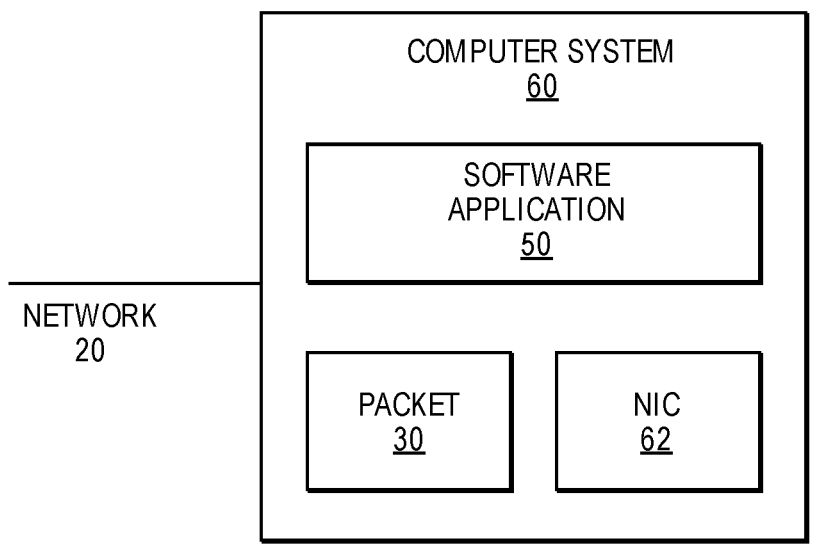
FIG. 1A is an illustration of a computer system which may receive a packet over network according to an embodiment of the invention.

FIG. 1A is an illustration of a computer system 60 which may receive a plurality of packets, such as packet 30, over network 20 according to an embodiment of the invention. Computer system 60 represents any type of computer system capable of receiving packets over network 20, e.g., computer system 60 may correspond to a switch, a router, a firewall computer, a server, and the like. Software application 50, executing on computer system 60, broadly represents any type of software responsible for processing one or more packets, such as packet 30. Network 20, as broadly used herein, represents a wide variety of packet-based networks, including but not limited to, the Internet. As is well-understood in the art, computer system 60 will receive large numbers of packets over network 20.

In the prior art, when a software application receives an Ethernet packet from the network, the packet will already possess a CRC value that has been appended to the end of the packet. In the prior art, a network interface controller (NIC) checks that CRC value and removes the CRC value from the packet before sending the packet up the network stack (i.e., to a different network protocol layer) for further processing. However, some modern NICs have an ability to leave the CRC value in the packet.

Computer system 60 of FIG. 1A comprises network interface card (NIC) 62 in an embodiment. Embodiments of the invention make use of the CRC value that is present in the packet. Thus, network interface card (NIC) 62 is designed to not remove the CRC value from packet 30 upon receipt of packet 30 from network 20. Consequently, when packet 30 is processed by software application 50, packet 30 will comprise the CRC value.

Embodiments of the invention shall be discussed below with reference to software application 50 performing a cyclic redundancy check (CRC) on packet 30 in constant time. While FIG. 1A depicts a single packet, namely packet 30, it should be understood that software application 50 may process each packet received by computer system 60 in the same manner as that described herein with reference to packet 30.

Figure 1B:
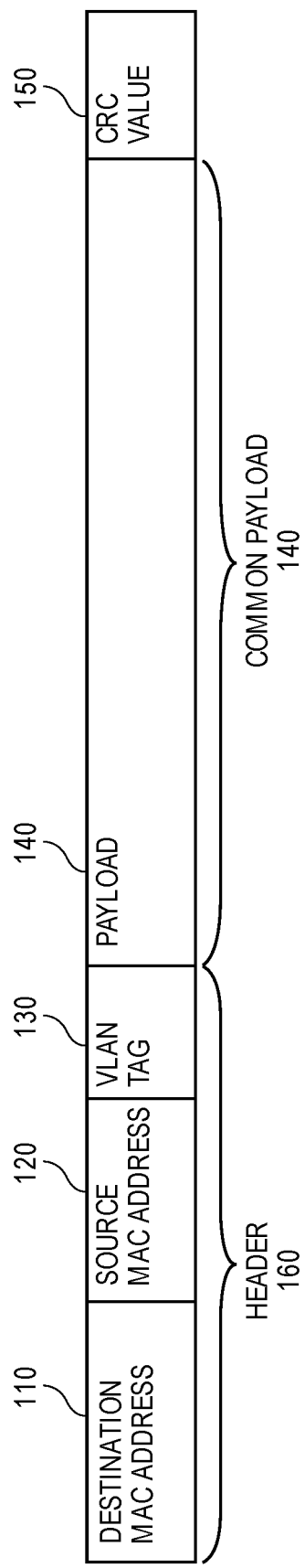
FIG. 1B is an illustration of a packet as received and upon which a cyclic redundancy check (CRC) may be performed according to an embodiment of the invention.
Figure 1C:
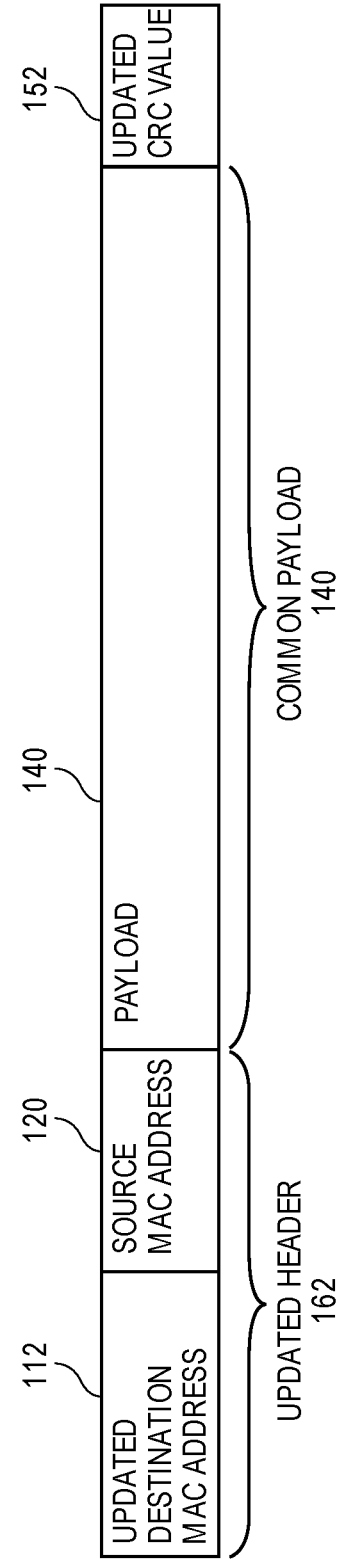
FIG. 1C is an illustration of a packet with an updated header and upon which a cyclic redundancy check (CRC) may be performed according to an embodiment of the invention.

To illustrate the process performed by embodiments upon packet 30, different states of packet 30 are illustrated in FIGS. 1B and 1C, where FIG. 1B is an illustration of packet 30 upon receipt by computer system 60 and prior to being processed by an embodiment of the invention, and FIG. 1C is an illustration of packet 30 after having an updated header processed to possess an updated CRC value in accordance with an embodiment of the invention. FIG. 1B depicts packet 30 having a header 160, a common payload 140, and a CRC value 150. FIG. 1C depicts packet 30 having an updated header 162, a common payload 140, and an updated CRC value. Advantageously, common payload 140 is not changed during packet processing.

Figure 2:
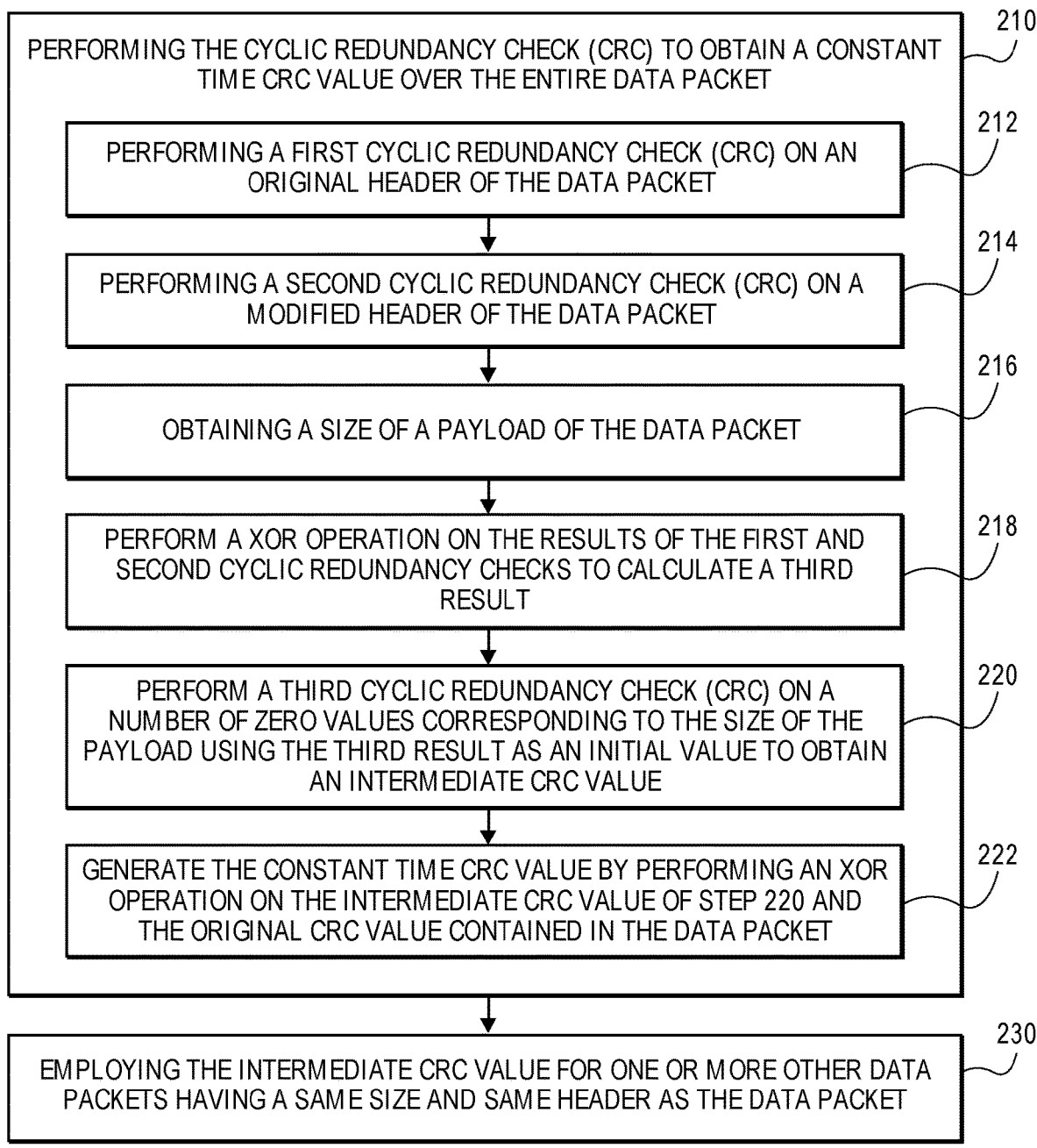
FIG. 2 is a flowchart illustrating the functional steps of performing a cyclic redundancy check (CRC) in constant time on a data packet according to an embodiment of the invention.

FIG. 2 is a flowchart illustrating the functional steps of performing a cyclic redundancy check (CRC) on a data packet in constant time according to an embodiment of the invention. As shown in FIG. 2, step 210 involves a plurality of sub-steps, i.e., sub-steps 212-220. In the performance of step 210, software application 50, software application 50 may perform certain processing on packet 30 and, thereafter, use the result of that processing to convert CRC value 150 to updated CRC value 152 in constant time to obtain the constant time CRC value. Thereafter, software application 50 may remove CRC value 150 from packet 30 and in its stead, insert the constant time CRC value, which is depicted in FIG. 1C as updated CRC value 152. Packet 30, once in possession of updated CRC value 152, may then be forwarded to its next destination. Note that in the performance of the steps of FIG. 2, software application 50 will modify the destination MAC address 110 of packet 30 as appropriate and may strip VLAN tag 130 from packet 30.

In an embodiment, initially in step 212 in FIG. 2, a first cyclic redundancy check (CRC) is performed by software application 50 on a byte stream of header 160 of packet 30 as received. The state of packet 30 as received is shown in FIG. 1B. FIG. 1B depicts header 160 of packet 30, common payload 140 of packet 30, and a CRC value 150 for packet 30.

Header 160 of packet 30 comprises a destination MAC address 110, a source MAC address 120, and potentially a VLAN tag 130. VLAN tag 130 refers to a 802.1Q VLAN header under the IEEE standard IEEE 802.1Q-1998. Common payload 140 of packet 30 is not changed or altered during the processing of step 210 or any sub-step thereof.

Thereafter, in step 214, a second cyclic redundancy check (CRC) is performed by software application 50 on a byte stream of updated header 162 of packet 30. Updated header 162 is shown in FIG. 1C and comprises updated destination MAC address 112 and the source MAC address 120. Updated destination MAC address 112 refers to the MAC address of the next destination to which packet 30 is to be sent over network 20, while source MAC address 120 refers to the MAC address of the original sender of packet 30. Software application 50, or some other entity, may update packet 30 to possess updated header 162 before the performance of step 214.

In step 216, software application 50 determines a size of payload 140 of packet 30. Step 216 may involve determine the number of bits comprising payload 140 in an embodiment.

In step 218, software application 50 performs an XOR operation on the CRC value obtained in step 212 and the CRC value obtained in step 214 to generate a result.

Thereafter, in step 220, software application 50 generates an Intermediate CRC value by performing a third cyclic redundancy check (CRC) on a number of zero values corresponding to the size of the payload that was determined in step 16. The third CRC performed in step 220 uses the result obtained in step 218 as an initial value (also known as a CRC register) of the CRC algorithm.

Thereafter, in step 222, software application 50 may generate updated CRC value 152 (which is the constant time CRC value) by performing an XOR operation on the Intermediate CRC value of step 220 and the CRC value 150, which is the original CRC value contained within data packet 30 upon receipt by computer system 60.

Once updated CRC value 152 is generated in step 222, updated CRC value 152 may be appended to payload 140 in place of CRC value 150 for packet 30 as shown in FIG. 1C, and thereafter, packet 30 may be sent over network 20 to a new destination.

Note that the calculation of the updated CRC value 152 in step 222 only depends upon (a) header 160, (b) updated header 162, and (c) the size of payload 140 determined in step 216; however, the calculation of updated CRC value 152 does not depend on the contents of payload 140. Since software application 50 will process a limited number of destination MAC addresses/VLANs, this means that software application 50 need only calculate certain Intermediate CRC values once for each combination of header 160, updated header 162, and payload size. Thereafter, once the Intermediate CRC value is known or calculated for packet 30, then it may be reused without having to recalculate this value.

In step 230, Intermediate CRC obtained in step 220 is employed in generating the updated CRC value 152 for one or more other packets having the same payload size and same header as packet 30.

Note that in the above discussion, the steps of initial and final inverting of CRC register (which are required by Ethernet standard) are skipped, as these steps are not necessarily required in all CRC algorithms. Embodiments of the invention have broader applicability than just an Ethernet CRC only. In the given example above, the Ethernet header was modified. However, embodiments will work with IP header modifications. The only difference is that the length of these headers will change.

Embodiments of the invention enable a CRC value to be calculated for packet 30 by software application 50 in a manner that has constant asymptotic complexity. Further, embodiments of the invention will not overload CPU cache of computer system 60 because the inventive approach loads packet data only once in the calculation of updated CRC value 152. Moreover, the processing of all network traffic with the same headers will then use this Intermediate CRC value to update the CRC value 150.

Embodiments of the invention may consume additional memory as compared to other prior art approaches for calculating a CRC; for example, embodiments may consume an amount of memory as big as number of different headers multiplied by number of packet sizes. Nevertheless, the inventive approach discussed herein yields a significant performance gain over prior art approaches.

Figure 3:
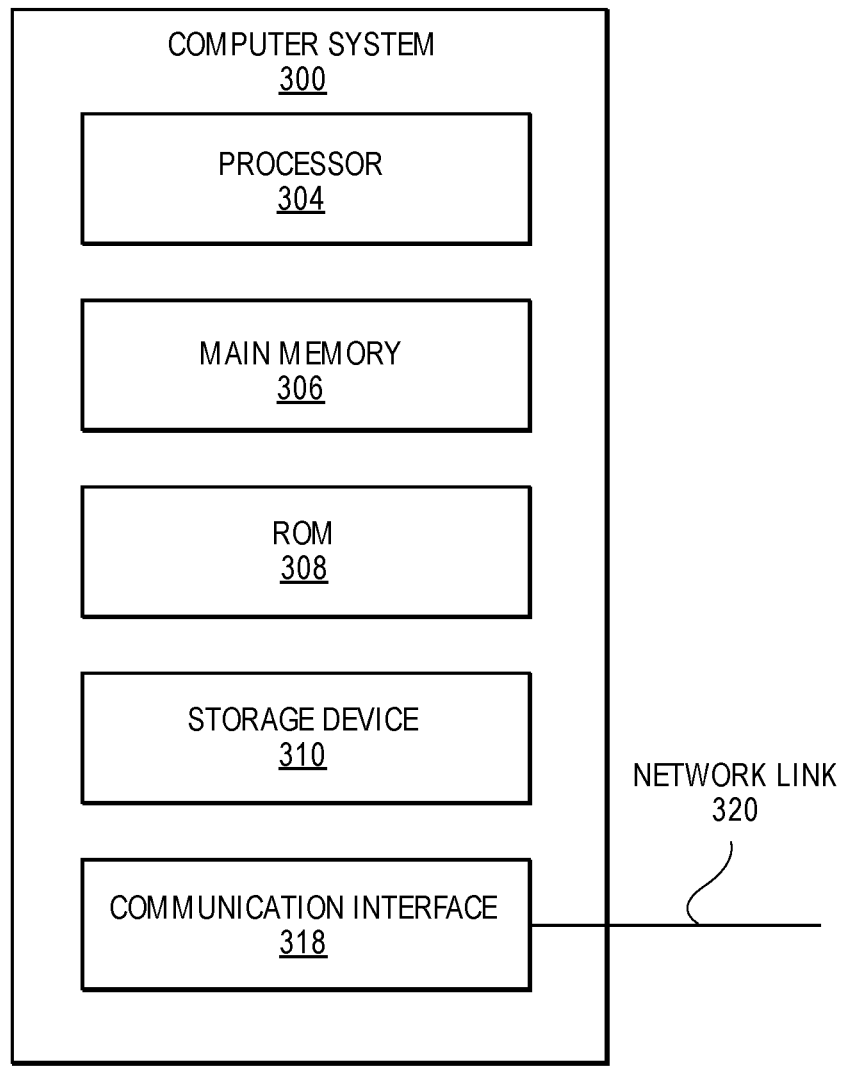
FIG. 3 is a block diagram that illustrates a computer system upon which an embodiment of the invention may be implemented.

FIG. 3 is a block diagram that illustrates a computer system 300, which may correspond to computer system 50 in an embodiment of the invention. In an embodiment, computer system 300 includes processor 304, main memory 306, ROM 308, storage device 310, communication interface 318, and communications bus 330. Computer system 300 includes at least one processor 304 for processing information. Computer system 300 also includes a main memory 306, such as a random-access memory (RAM) or other dynamic storage device, for storing information and instructions to be executed by processor 304. Main memory 306 also may be used for storing temporary variables or other intermediate information during execution of instructions to be executed by processor 304. Computer system 300 further includes a read only memory (ROM) 308 or other static storage device for storing static information and instructions for processor 304. A storage device 310, such as a magnetic disk or optical disk, is provided for storing information and instructions.

Embodiments of the invention are related to the use of computer system 300 for implementing the techniques described herein. According to one embodiment of the invention, those techniques are performed by computer system 300 in response to processor 30 executing one or more sequences of one or more instructions contained in main memory 306. Such instructions may be read into main memory 306 from another computer-readable medium, such as storage device 310. Execution of the sequences of instructions contained in main memory 306 causes processor 304 to perform the process steps described herein. In alternative embodiments, hard-wired circuitry may be used in place of or in combination with software instructions to implement embodiments of the invention. Thus, embodiments of the invention are not limited to any specific combination of hardware circuitry and software.

The term "non-transitory computer-readable storage medium" as used herein refers to any tangible medium that participates in storing instructions which may be provided to processor 304 for execution. Non-limiting, illustrative examples of non-transitory computer-readable media include, for example, a floppy disk, a flexible disk, hard disk, magnetic tape, or any other magnetic medium, a CD-ROM, any other optical medium, a RAM, a PROM, and EPROM, a FLASH-EPROM, any other memory chip or cartridge, or any other medium from which a computer can read.

Various forms of non-transitory computer-readable media may be involved in carrying one or more sequences of one or more instructions to processor 304 for execution. For example, the instructions may initially be carried on a magnetic disk of a remote computer. The remote computer can load the instructions into its dynamic memory and send the instructions over a network link 320 to computer system 300.

Communication interface 318 provides a two-way data communication coupling to a network link 320 that is connected to a local network. For example, communication interface 318 may be an integrated service digital network (ISDN) card or a modem to provide a data communication connection to a corresponding type of telephone line. As another example, communication interface 318 may be a local area network (LAN) card to provide a data communication connection to a compatible LAN. Wireless links or optical links may also be implemented. In any such implementation, communication interface 318 sends and receives electrical, electromagnetic or optical signals that carry digital data streams representing various types of information.

Network link 320 typically provides data communication through one or more networks to other data devices. For example, network link 320 may provide a connection through a network to one or more other computer systems.

Computer system 300 can send messages and receive data, including program code, through the network(s), network link 320 and communication interface 318. For example, a server might transmit a requested code for an application program through the Internet, a local ISP, a local network, subsequently to communication interface 318. The received code may be executed by processor 304 as it is received, and/or stored in storage device 310, or other non-volatile storage for later execution.

Communications 330 is a mechanism for enabling various components of computer system 300 to communicate with one another. In the foregoing specification, embodiments of the invention have been described with reference to numerous specific details that may vary from implementation to implementation. Thus, the sole and exclusive indicator of what is the invention and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A non-transitory, computer-readable storage medium storing one or more sequences of instructions for transmitting a data packet over a computer network, which when executed by one or more processors, cause:
   at an apparatus, receiving the data packet;
   at the apparatus, performing a cyclic redundancy check (CRC) to obtain a constant time CRC value over the entire data packet in constant time;
   upon determining that the constant time CRC value indicates that a portion of the data packet changed during transmission, performing a corrective action upon the data packet to produce a corrected data packet, wherein performing said cyclic redundancy check (CRC) over the entire data packet in constant time comprises:
   performing a first cyclic redundancy check (CRC) on an original header of the data packet to obtain a first result,
   performing a second cyclic redundancy check (CRC) on a modified header of the data packet to obtain a second result,
   obtaining a size of a payload of the data packet,
   performing a XOR operation of the first result and the second result to calculate a third result,
   generating an intermediate CRC value by performing a third cyclic redundancy check (CRC) on a number of zero values corresponding to the size of the payload of the data packet, wherein the third cyclic redundancy check (CRC) uses the third result as an initial value, and generating the constant time CRC value by performing an XOR operation in the intermediate CRC value and an original CRC value contained in the data packet; and after performing the correction action upon the data packet, the apparatus transmitting the corrected data packet on the computer network.

2. The non-transitory, computer-readable storage medium of claim 1, wherein said original header of the data packet and said modified header of the data packet are both an Ethernet header for the data packet.

3. The non-transitory, computer-readable storage medium of claim 1, wherein said original header of the data packet and said modified header of the data packet are both an IP header for the data packet.

4. The non-transitory, computer-readable storage medium of claim 1, wherein execution of the one or more sequences of instructions further cause:

employing the third result in the generation of other constant time CRC values for one or more other data packets having a same size and same header as said data packet.

5. An apparatus for transmitting a data packet over a computer network, comprising:

one or more processors; and one or more non-transitory computer-readable storage mediums storing one or more sequences of instructions, which when executed, cause:

at an apparatus, receiving the data packet;

at the apparatus, performing a cyclic redundancy check (CRC) to obtain a CRC value over the entire data packet in constant time, wherein performing said cyclic redundancy check (CRC) over the entire data packet in constant time comprises:

performing a first cyclic redundancy check (CRC) on an original header of the data packet to obtain a first result, performing a second cyclic redundancy check (CRC) on a modified header of the data packet to obtain a second result, obtaining a size of a payload of the data packet, performing a XOR operation of the first result and the second result to calculate a third result, generating an intermediate CRC value by performing a third cyclic redundancy check (CRC) on a number of zero values corresponding to the size of the payload of the data packet, wherein the third cyclic redundancy check (CRC) uses the third result as an initial value, and generating the constant time CRC value by performing an XOR operation in the intermediate CRC value and an original CRC value contained in the data packet;

upon determining that the constant time CRC value indicates that a portion of the data packet changed during transmission, performing a corrective action upon the data packet to produce a corrected data packet; and after performing the correction action upon the data packet, the apparatus transmitting the corrected data packet on the computer network.

6. The apparatus of claim 5, wherein said original header of the data packet and said modified header of the data packet are both an Ethernet header for the data packet.

7. The apparatus of claim 5, wherein said original header of the data packet and said modified header of the data packet are both an IP header for the data packet.

8. The apparatus of claim 5, wherein execution of the one or more sequences of instructions further cause:

employing the third result in the generation of other constant time CRC values for one or more other data packets having a same size and same header as said data packet.

9. A method for transmitting a data packet over a computer network, comprising:

at an apparatus, receiving the data packet;

at the apparatus, performing a cyclic redundancy check (CRC) to obtain a CRC value over the entire data packet in constant time, wherein performing said cyclic redundancy check (CRC) over the entire data packet in constant time comprises:

performing a first cyclic redundancy check (CRC) on an original header of the data packet to obtain a first result, performing a second cyclic redundancy check (CRC) on a modified header of the data packet to obtain a second result, obtaining a size of a payload of the data packet, performing a XOR operation of the first result and the second result to calculate a third result, generating an intermediate CRC value by performing a third cyclic redundancy check (CRC) on a number of zero values corresponding to the size of the payload of the data packet, wherein the third cyclic redundancy check (CRC) uses the third result as an initial value, and generating the constant time CRC value by performing an XOR operation in the intermediate CRC value and an original CRC value contained in the data packet;

upon determining that the constant time CRC value indicates that a portion of the data packet changed during transmission, performing a corrective action upon the data packet to produce a corrected data packet; and after performing the correction action upon the data packet, the apparatus transmitting the corrected data packet on the computer network.

10. The method of claim 9, wherein said original header of the data packet and said modified header of the data packet are both an Ethernet header for the data packet.

11. The method of claim 9, wherein said original header of the data packet and said modified header of the data packet are both an IP header for the data packet.

12. The method of claim 9, further comprising:

employing the third result in the generation of other constant time CRC values for one or more other data packets having a same size and same header as said data packet.

13. A non-transitory, computer-readable storage medium storing one or more sequences of instructions for transmitting a data packet over a computer network, which when executed by one or more processors, cause:

at an apparatus, receiving the data packet;

at the apparatus, performing a cyclic redundancy check (CRC) to obtain a constant time CRC value over the entire data packet in constant time;

upon determining that the constant time CRC value indicates that a portion of the data packet changed during transmission, performing a corrective action upon the data packet to produce a corrected data packet, wherein performing said cyclic redundancy check (CRC) over the entire data packet in constant time comprises:
  generating an intermediate CRC value by performing a first cyclic redundancy check (CRC) on a number of zero values corresponding to the size of the payload of the data packet, wherein an initial value of the first cyclic redundancy check (CRC) is determined using a header of the data packet, and
  generating the constant time CRC value by using the intermediate CRC value and an original CRC value contained in the data packet; and
after performing the correction action upon the data packet, the apparatus transmitting the corrected data packet on the computer network.

14. An apparatus for transmitting a data packet over a computer network, comprising:
  one or more processors; and
  one or more non-transitory computer-readable storage mediums storing one or more sequences of instructions, which when executed, cause:
    at an apparatus, receiving the data packet;
    at the apparatus, performing a cyclic redundancy check (CRC) to obtain a CRC value over the entire data packet in constant time, wherein performing said cyclic redundancy check (CRC) over the entire data packet in constant time comprises:
      generating an intermediate CRC value by performing a first cyclic redundancy check (CRC) on a number of zero values corresponding to the size of the payload of the data packet, wherein an initial value of the first cyclic redundancy check (CRC) is determined using a header of the data packet, and
      generating the constant time CRC value by using the intermediate CRC value and an original CRC value contained in the data packet;
    upon determining that the constant time CRC value indicates that a portion of the data packet changed during transmission, performing a corrective action upon the data packet to produce a corrected data packet; and
    after performing the correction action upon the data packet, the apparatus transmitting the corrected data packet on the computer network.

15. A method for transmitting a data packet over a computer network, comprising:
  at an apparatus, receiving the data packet;
  at the apparatus, performing a cyclic redundancy check (CRC) to obtain a CRC value over the entire data packet in constant time, wherein performing said cyclic redundancy check (CRC) over the entire data packet in constant time comprises:
    generating an intermediate CRC value by performing a first cyclic redundancy check (CRC) on a number of zero values corresponding to the size of the payload of the data packet, wherein an initial value of the first cyclic redundancy check (CRC) is determined using a header of the data packet, and
    generating the constant time CRC value by using the intermediate CRC value and an original CRC value contained in the data packet;
  upon determining that the constant time CRC value indicates that a portion of the data packet changed during transmission, performing a corrective action upon the data packet to produce a corrected data packet; and
  after performing the correction action upon the data packet, the apparatus transmitting the corrected data packet on the computer network.

* * * * *